(12) United States Patent
Prentice

(10) Patent No.: US 7,733,248 B2
(45) Date of Patent: Jun. 8, 2010

(54) MEASURING AND REGENERATING A VARIABLE PULSE WIDTH

(75) Inventor: Seth Prentice, Auburn, ME (US)

(73) Assignee: Fairchild Semiconductor Corporation, South Portland, ME (US)

( * ) Notice: Subject to any disclaimer, the term of this patent is extended or adjusted under 35 U.S.C. 154(b) by 15 days.

(21) Appl. No.: 12/233,034

(22) Filed: Sep. 18, 2008

(65) Prior Publication Data

US 2010/0067635 A1    Mar. 18, 2010

(51) Int. Cl.
*H03M 9/00*    (2006.01)

(52) U.S. Cl. .................. 341/100; 341/101; 341/178; 341/182; 375/242; 375/376; 327/31; 327/32; 327/147

(58) Field of Classification Search .......... 341/100, 341/101, 178, 182; 375/242, 376; 327/31, 327/32, 147
See application file for complete search history.

(56) References Cited

U.S. PATENT DOCUMENTS

| 4,367,497 | A | * | 1/1983 | Jenkins | 360/48 |
|---|---|---|---|---|---|
| 4,885,584 | A | * | 12/1989 | Dalrymple | 341/101 |
| 4,901,076 | A | * | 2/1990 | Askin et al. | 341/100 |
| 5,325,398 | A | * | 6/1994 | Murakami et al. | 375/237 |
| 5,576,980 | A | * | 11/1996 | Whetsel | 702/119 |
| 6,072,338 | A | * | 6/2000 | Nishiuchi | 327/31 |
| 6,850,378 | B2 | * | 2/2005 | Conteras et al. | 360/46 |
| 6,992,792 | B2 | * | 1/2006 | Blumer | 358/1.2 |
| 7,079,528 | B2 | * | 7/2006 | Ziegler et al. | 370/352 |
| 7,145,920 | B2 | * | 12/2006 | Kinoshita et al. | 370/503 |
| 7,474,234 | B2 | * | 1/2009 | Wagensohner et al. | 341/53 |
| 7,477,172 | B1 | * | 1/2009 | Lo et al. | 341/101 |
| 7,492,690 | B2 | * | 2/2009 | Yen | 369/59.21 |
| 2009/0080540 | A1 | * | 3/2009 | Asano et al. | 375/242 |

* cited by examiner

*Primary Examiner*—Linh V Nguyen
(74) *Attorney, Agent, or Firm*—Cesari and McKenna, LLP; Edwin H. Paul, Esq.

(57) ABSTRACT

A system and process for receiving a variable pulse width signal and measuring and serially sending the measurements to a receiver that deserializes and regenerates the variable pulse width signal. Data bits may be embedded with the variable pulse width clock measurements and serially sent out. The measurements are illustratively accomplished using a reference clock and a phase locked loop.

8 Claims, 2 Drawing Sheets

MEASURING AND REGENERATING A VARIABLE PULSE WIDTH

BACKGROUND OF THE INVENTION

1. Field of the Invention

The present invention relates to regenerating and outputting a pulse width from an input pulse width that varies.

2. Background Information

In many electronic communication devices, for example, mobile phones with LCD (Liquid Crystal Display) screens, the pulse that loads (/WE—Write Enable or Pixel Clock) new data has a pulse width requirement. Moreover, many mobile phones and similar devices have a main LCD screen and a secondary LCD screen, and these two LCD screens may require different /WE pulse widths. When the screens are loaded, via a parallel connection to a microprocessor, the processor will output the required pulse widths. However, when a serializer/deserializer is inserted between the microprocessor and the LCD screens, the /WE pulse widths must be accommodated. The serializer/deserializer is introduced in such devices to reduce the number of data/control is signals that must often traverse a flexible circuit that is between two sections of the mobile phone or other such device.

That is, when the /WE pulse width from the microprocessor changes widths and loads data into a serializer that sends the data a bit at a time with a bit clock. The serial data and the bit clock signals are sent to a deserializer that loads the serial data with the bit clock and presents a parallel data word to the LCD screen. In order to send a WE pulse with the correct pulse width, one or two separate signals could be used to send the correct /WE pulse from the microprocessor directly, but that approach uses additional lines or wires for the signals, and that detracts from the serialization/deserialization approach.

It would be advantageous to not use an additional line to transmit the /WE pulse between the serializer and the deserializer.

SUMMARY OF THE INVENTION

The present invention provides a technique for measuring the width of a pulse, for example a /WE pulse, generated from the microprocessor (or the equivalent) meant to load parallel data into an LCD screen. That measured width is then encoded and sent with the serial data to the deserializer that converts the serial data into parallel data. The parallel display data is presented to the LCD screen and the serialized /WE pulse width information is then employed to regenerate the /WE pulse width. The regenerated /WE pulse is used to load the parallel data into the LCD screen electronics.

The width of a pulse, illustratively, is measured by counting the number cycles of a faster clock that occur within the targeted pulse width. Illustratively, the serial bit clock used by a serializer to send out the serial data bits is much faster than the targeted pulse width and eight or more cycles of the faster clock may occur within the targeted pulse width. In this instance a counter may be enabled at the start of the targeted pulse width and disabled when the targeted pulse width ends. The count is then an indicator of the is pulse width. That count may be attached to the beginning or the end of the serial data bits and recovered in the deserializer receiver. The serial bit clock and the counter value may be used to regenerate the proper pulse width.

It will be appreciated by those skilled in the art that although the following Detailed Description will proceed with reference being made to illustrative embodiments, the drawings, and methods of use, the present invention is not intended to be limited to these embodiments and methods of use. Rather, the present invention is of broad scope and is intended to be defined as only set forth in the accompanying claims.

BRIEF DESCRIPTION OF THE DRAWINGS

The invention description below refers to the accompanying drawings, of which.

DETAILED DESCRIPTION OF AN ILLUSTRATIVE EMBODIMENT

Figure 1:
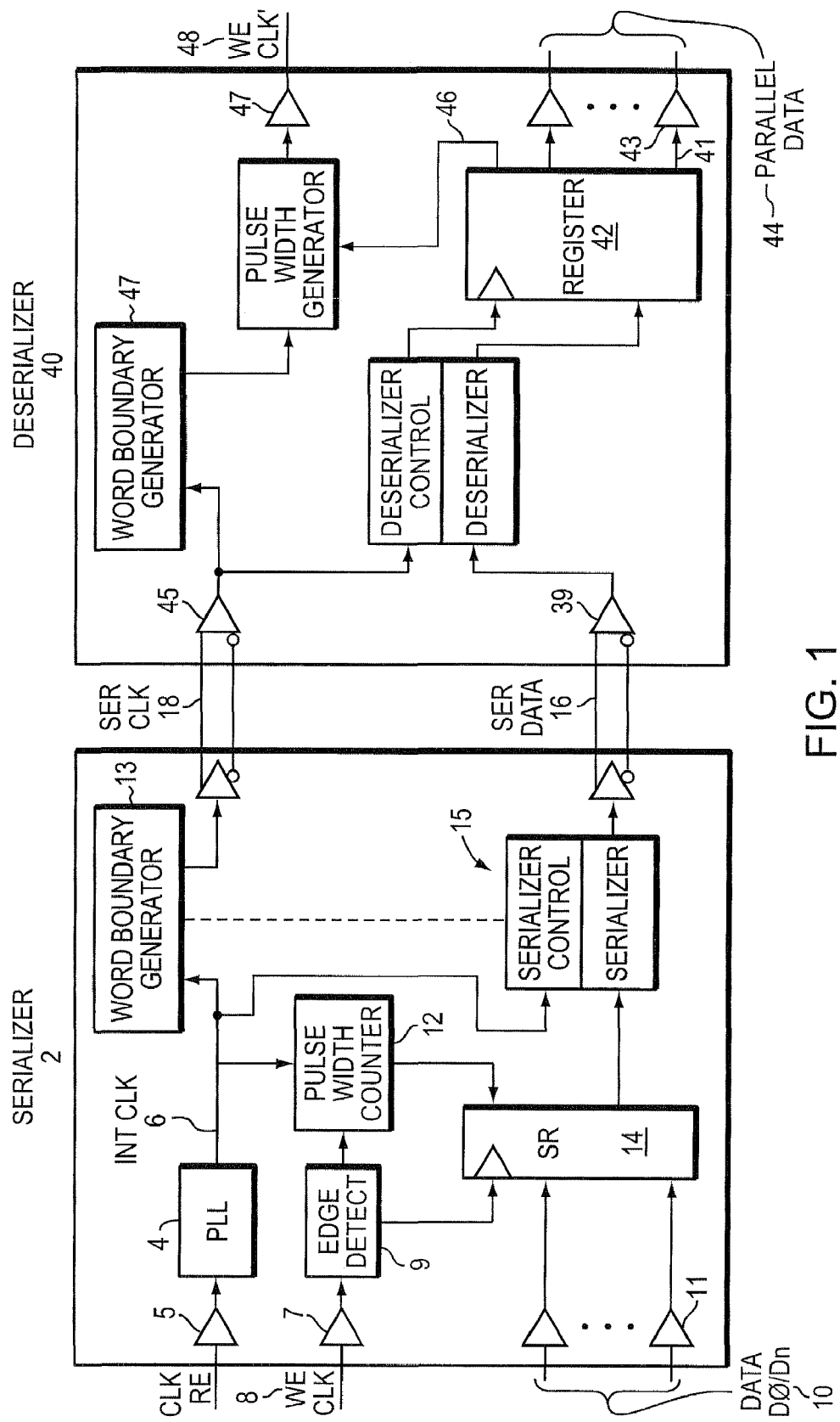
FIG. 1 is a schematic block diagram of a serializer/deserializer.

FIG. 1 illustrates a serializer 2 with a phase locked loop, PLL 4, that receives a buffered 5 reference clock, CLKREF, and produces an internal clock, INTCLK 6. The INTCLK is a bit clock, SERCLK 18, that travels with and distinguishes the serialized data bits. SERDATA 16, for the deserializer 40

A microprocessor or other logic controller provides a buffered 7 WECLK 8, and a set of parallel data bits 10. A WECLK edge is detected 9 that enables a pulse width counter 12 to count INTCLK 6 pulses. The WECLK also is used to load buffered 11 parallel data bits 10 into a shift register, SR, 14.

When the WECLK goes false, the pulse width counter 12 value is loaded into one end of the SR 14, by the edge detector 9. The INTCLK clocks the data out of the SR 14 bit by bit, or serially, via a serializer and serializer control 15 onto the differential SER DATA lines 16. The INTCLK 6 also travels with the SER DATA on the SER CLK 18 is line and provides timing signals that may be used to discern each bit from one another. The word boundary generator 13 ensures that the differential SERCLK will include all the serial data bit and the pulse width counter bits in one continuous bit stream. For example, if there were eight data bits and the pulse width counter had four bits, a total of twelve bits with twelve clocks would be sent to the deserializer.

FIG. 1 includes a schematic block diagram deserializer 40. The SER DATA 16 is buffered 39 and clocked into a shift register 42 by a buffered 45 SERCLK 18. That shift register 42 parallel output is buffer 43 and presented to some receiving system, e.g., an LCD display. The buffered SERCLK is input to a word boundary generator 47 that, together with the received pulse width counter bits 46, regenerate a buffered 47 WECLK' 48 that has about of the same width as the WECLK 8 input to the serializer 4. The WECLK' 48 loads the parallel data 44 into the LCD display circuits.

Figure 2A:
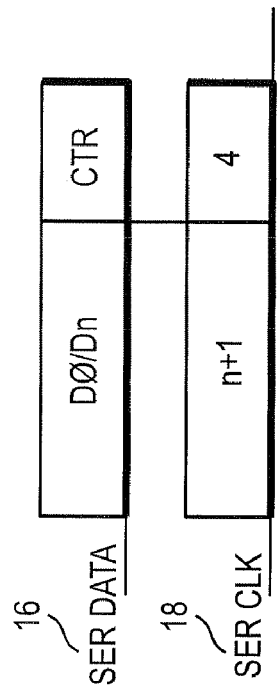
FIG. 2A is a timing diagram illustrating the operations with the serializer of FIG. 1.

FIG. 2A illustrates the relative timing of the WECLK and the INTCLK 6. The INTCLK starts incrementing the PULSE WIDTH COUNTER 12 when WE CLK is low and the first positive going INTCLK 22 occurs. The numeric series 22 illustrates a value that may be found in the PULSE WIDTH COUNTER 12. Here there are eight INTCLK positive going edges within the negative pulse width of WECLK 8. If the CTR with a four bit binary counter, the four bits in the counter would contain 1000 to represent a count of eight.

Figure 2B:
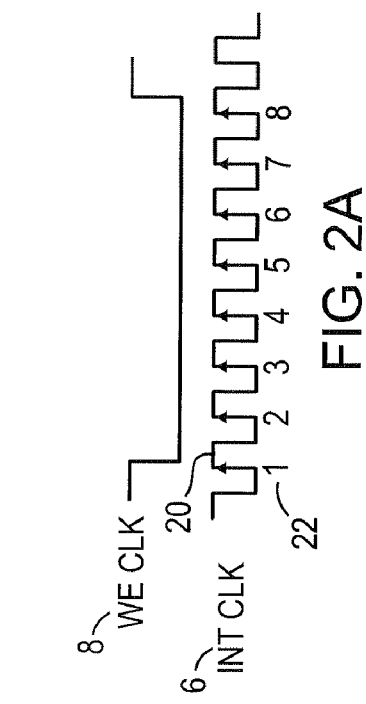
FIG. 2B is a schematic of a synchronizing circuit.

FIG. 2B illustrates a D-FLOP 32 that is set on the next INTCLK pulse when WELCLK+ is true. The subsequent INTCLK pulse passes the NAND gate 34 to produce a low going SYNINTCLK− signal. The INTCLK's will continue to pass the NAND 34 until WELCLK+ becomes untrue whereupon the next INTCLK will pass the NAND 34 but reset the D-FLOP. That will prevent any further SYNINT CLK's from occurring until WECLK+ goes true again. This circuit, however, will ensure that the SYNINTCLK pulses are full width. The SYNINTCLK− signal may replace the INTCLK and be counted by the PULSE WIDTH COUNTER 12.

Figure 3:
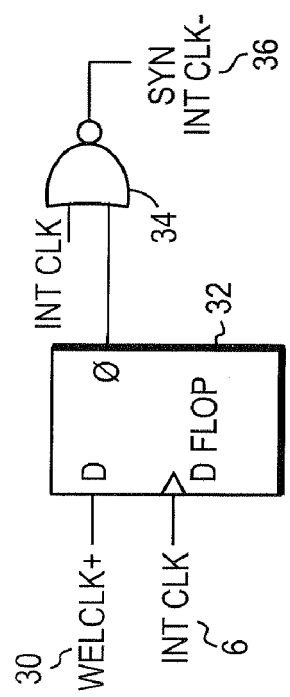
FIG. 3 is a timing representation of the serial data and the accompanying serial clock.
Figure 4:
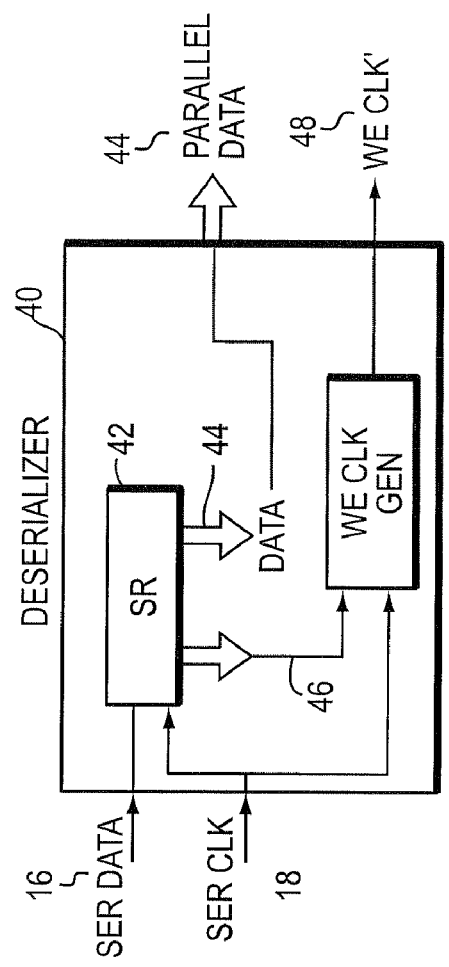
FIG. 4 is a schematic block diagram of deserializer.

In one application, the four PULSE WIDTH COUNTER 12 bits may be placed at an end on the SR 14, where they will be shifted out either before or after the data bits. For example, if the data were an eight bit byte, D0-D7, and the WECLK was eight INTCLK cycles wide, there would be twelve SERCLK pulses sent with the eight serial data bits and the four serial CTR bits. That is: (n+1) plus four SERCLK 18 cycles. FIG. 3 illustrates these signals.

It should be understood that above-described embodiments are being presented herein as examples and that many variations and alternatives thereof are possible. Accordingly, the present invention should be viewed broadly as being defined only as set forth in the hereinafter appended claims.

What is claimed is:

1. A system to serialize and deserialize data and regenerate a variable pulse width signal, the system comprising:
   a counter that receives and is enabled by the variable pulse width signal,
   a reference clock that increments the counter when the counter is enabled;
   a serializer that is loaded by the variable width pulse with data and with the counter contents and that then sends out the data and counter contents serially;
   a deserializer that receives and deserializes the serial data and serial counter contents and outputs the counter contents;
   a regenerator that receives the counter contents from the deserializer and the reference clock, and regenerates the variable pulse width signal.

2. The system of claim 1 wherein the data bits and the counter contents are serially sent out embedded with each other, and further comprising a bit clock that travels with and distinguishes the data and the counter content bits, and a word boundary generator that limits the number of bit clock pulses to the number of data bits plus the number of bits in the counter contents.

3. The system of claim 1 wherein the counter is a binary counter.

4. The system of claim 3 further comprising a phase locked loop that generates the bit clock from a reference clock.

5. A process for regenerating a variable pulse width signal, the process comprising the steps of:
   enabling a counter with the variable pulse width signal,
   clocking the counter when the counter is enabled;
   serializing and sending out the counter contents serially;
   receiving and deserializing the counter contents;
   regenerating the variable pulse width signal from the counter contents, wherein the step of regenerating the variable pulse width signal includes the step of clocking a regenerating circuit a number of clock cycles that equals the counter contents.

6. The process of claim 5 further comprising the step of:
   embedding a group of data bits with the counter contents, wherein the data bits and the counter contents are serially sent out embedded with each other.

7. The process of claim 5 further comprising the step of clocking the serialized data and counter content bits with bit clock pulses; and limiting the number of bit clock pulses to the number of data and counter content bits.

8. The process of claim 7 further comprising the step of phase locking the bit clock pulses to a reference clock.

* * * * *